US006967707B2

(12) United States Patent
Hickman

(10) Patent No.: US 6,967,707 B2
(45) Date of Patent: *Nov. 22, 2005

(54) DEVICE AND METHOD OF CORRECTING EXPOSURE DEFECTS IN PHOTOLITHOGRAPHY

(75) Inventor: Craig A. Hickman, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/975,699

(22) Filed: Oct. 28, 2004

(65) Prior Publication Data

US 2005/0068513 A1 Mar. 31, 2005

Related U.S. Application Data

(63) Continuation of application No. 10/608,913, filed on Jun. 26, 2003, now Pat. No. 6,812,999, which is a continuation of application No. 09/332,856, filed on Jun. 14, 1999, now Pat. No. 6,727,975.

(51) Int. Cl.[7] .................. G03B 27/54; G03B 27/68; G03B 27/72; G03F 9/00
(52) U.S. Cl. ................... 355/52; 355/67; 355/71; 430/5
(58) Field of Search ............. 355/52, 53, 67, 355/71; 430/5, 322; 359/559, 560, 562, 564, 359/885, 889

(56) References Cited

U.S. PATENT DOCUMENTS

| 4,588,293 | A | * | 5/1986 | Axelrod ................ 356/237.2 |
| 5,055,871 | A | * | 10/1991 | Pasch ..................... 355/53 |
| 5,142,132 | A | * | 8/1992 | MacDonald et al. ..... 250/201.9 |
| 5,486,896 | A | * | 1/1996 | Hazama et al. ............ 355/71 |
| 5,521,033 | A | * | 5/1996 | Okamoto .................. 430/5 |
| 5,640,233 | A | * | 6/1997 | McArthur et al. ......... 356/124 |
| 5,642,183 | A | * | 6/1997 | Sugihara et al. ........... 355/71 |
| 5,767,949 | A | * | 6/1998 | Noguchi et al. ........... 355/67 |
| 5,795,685 | A | * | 8/1998 | Liebmann et al. .......... 430/5 |
| 5,828,455 | A | * | 10/1998 | Smith et al. ............. 356/515 |
| 5,838,433 | A | * | 11/1998 | Hagiwara ................ 356/364 |
| 6,115,108 | A | * | 9/2000 | Capodieci ................ 355/77 |
| 6,151,103 | A | * | 11/2000 | Shu et al. ............... 355/71 |
| 6,235,434 | B1 | * | 5/2001 | Sweeney et al. ............ 430/5 |
| 6,346,979 | B1 | * | 2/2002 | Ausschnitt et al. ......... 355/53 |

* cited by examiner

Primary Examiner—Rodney Fuller
(74) Attorney, Agent, or Firm—Knobbe, Martens, Olson & Bear, LLP

(57) ABSTRACT

A corrective filter for use in an optical system to correct a defect in a reticle and/or pellicle. The corrective filter may be positioned between a light source and the reticle, between the reticle and a wafer, or in combination with the reticle and/or pellicle. The invention provides a method of characterizing the optical properties of the corrective filter in a photolithography system.

30 Claims, 5 Drawing Sheets

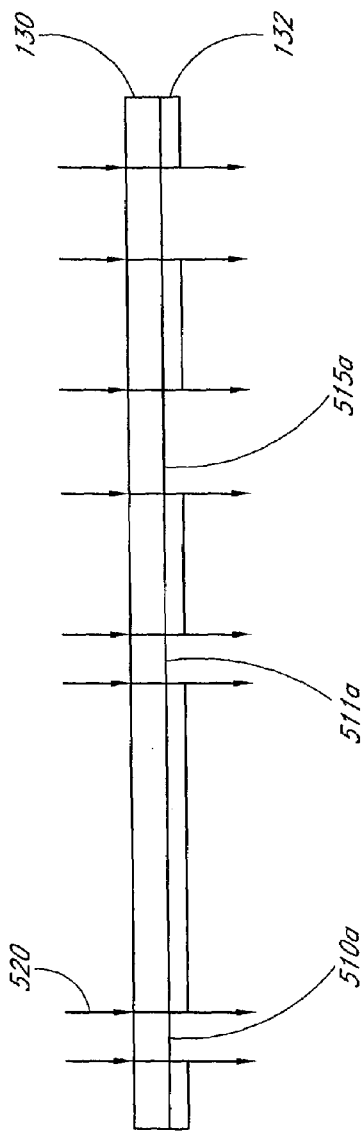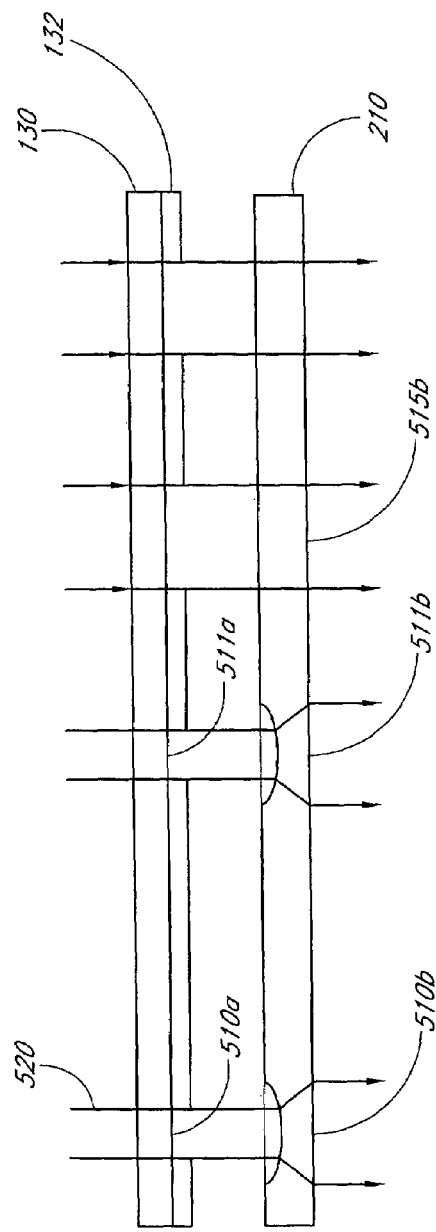

DEVICE AND METHOD OF CORRECTING EXPOSURE DEFECTS IN PHOTOLITHOGRAPHY

RELATED APPLICATIONS

This application is a continuation of, and hereby incorporates by reference the entire disclosure of, U.S. patent application Ser. No. 10/608,913, filed Jun. 26, 2003 now U.S. Pat. No. 6,812,999, which is a continuation of U.S. patent application Ser. No. 09/332,856, filed Jun. 14, 1999 (now issued as U.S. Pat. No. 6,727,975 on Apr. 27, 2004), which is also incorporated herein by reference.

BACKGROUND OF THE INVENTION

1. Field of the Invention

The invention relates generally to the correction of exposure variations in an optical system. More particularly, this invention relates to correcting variations introduced by one or more components, such as a reticle or pellicle, into the exposure field of the optical system.

2. Description of the Related Art

Optical systems are widely used in the microelectronics industry to manufacture semiconductor wafers by a process known as photolithography. Typically, a photolithography system comprises a light source configured to project light rays to a condenser lens. The condenser lens collimates the light rays towards a pellicle placed before (or after) a reticle. Typically, the reticle is an optically clear quartz substrate having a chrome pattern used to project an image onto a portion of a photoresist-coated wafer. The pellicle is a very thin, transparent film which seals off the reticle surface from airborne particulates and other forms of contamination. A projection lens is placed after the reticle to receive and focus the light rays onto an exposure field on the wafer.

In designing such an optical system, any one of these components may be vulnerable to manufacturing imperfections which, even if minutely small, may cause intolerable or unacceptable defects in the photoresist layer of the wafer. For example, aberrations due to defects in one or more lenses may include distortion, curvature of field, spherical aberration, and astigmatism. Moreover, distortions may be due to defects in the reticle that may be caused during manufacturing. For example, reticle defects may arise from impurities in the chrome, lack of adhesion of the chrome to the reticle, variances in ion beam used to produce chrome etching, or other similar defects. Reticle defects may cause intolerable or unacceptable variations in critical dimensions (CD's) in the exposure field. A CD represents the width or space of critical elements in an integrated circuit (IC).

Several attempts were made in the industry to compensate for general defects in the optical system. For example, in U.S. Pat. No. 5,640,233 issued to McArthur et al., a two-plate corrector is disclosed in a stepper configuration so that an image from a reticle plane is projected to an ideal image at an object plane. Based on the premise that depth of field correction made at the reticle plane induces insignificant distortion, McArthur describes placement of the two-plate corrector at the reticle plane to correct depth of field distortions caused by the lens system. However, McArthur does not describe how to correct defects resulting from specific components, such as the reticle or pellicle.

To eliminate undesirable variances that result from defects in the reticle, some manufacturers simply replace the defective reticle with a new reticle. Other manufacturers resort to discarding wafers having intolerable CD's caused by the defective reticle. In either case, a significant increase in manufacturing cost due to reticle defects has become unavoidable.

Therefore, there is a need in the industry to compensate for individual component defects without having to replace the component or discard any defective wafers resulting therefrom. The solution of correcting such defects should be cost-effective and easy to implement.

SUMMARY OF THE INVENTION

In one embodiment, the invention provides a system comprising a reticle comprising a pattern configured to receive light from a source and project a first image onto a geometric plane. The reticle further comprises a defect causing a deviation in the first image from a second image producible by a defect-free pattern. The system further comprises a filter located substantially in said geometric plane. The filter is configured to receive the first image substantially without optical processing after light passes through the reticle. The filter comprises at least one portion configured to substantially remove the deviation. In another embodiment, the system comprises a reticle comprising a pattern configured to receive light from a source and project a first image toward a geometric plane. The system further comprises an object having a defect formed therein, the object being located along a passage way of the light from the source to the plane. The defect causes a deviation in the first image from a second image producible by a defect-free object. The system further comprises a filter located immediately after the reticle along the passage way of the light from the source to the geometric plane. The filter comprises at least one portion configured to selectively modify the deviation in the first image.

In another embodiment, the invention provides a method of defining a photolithography system. The method comprises receiving at least one geometrical measurement about a feature in a first image projected from a defective pattern. The method further comprises receiving geometrical information about a feature in a second image producible by a defect-free pattern. The method further comprises determining a geometrical difference between the features in the first and second images. The geometric difference represents an optical deviation of the first image from the second image. The method further comprises determining based, at least in part, on the geometrical difference optical characteristics of an optical element configured to substantially reduce the optical deviation of the first image from the second image.

BRIEF DESCRIPTION OF THE DRAWINGS

The above and other aspects, features and advantages of the invention will be better understood by referring to the following detailed description, which should be read in conjunction with the accompanying drawings, in which:

FIG. 5A is a ray diagram of a reticle having one or more defects.

FIG. 5B is a ray diagram of the reticle of FIG. 5A after correction by the corrective filter in accordance with the invention.

DETAILED DESCRIPTION OF THE PREFERRED EMBODIMENT

The following description is not to be taken in a limiting sense, but is made merely for the purpose of describing the general principles of the invention. The scope of the invention should be determined with reference to the claims.

Figure 1:
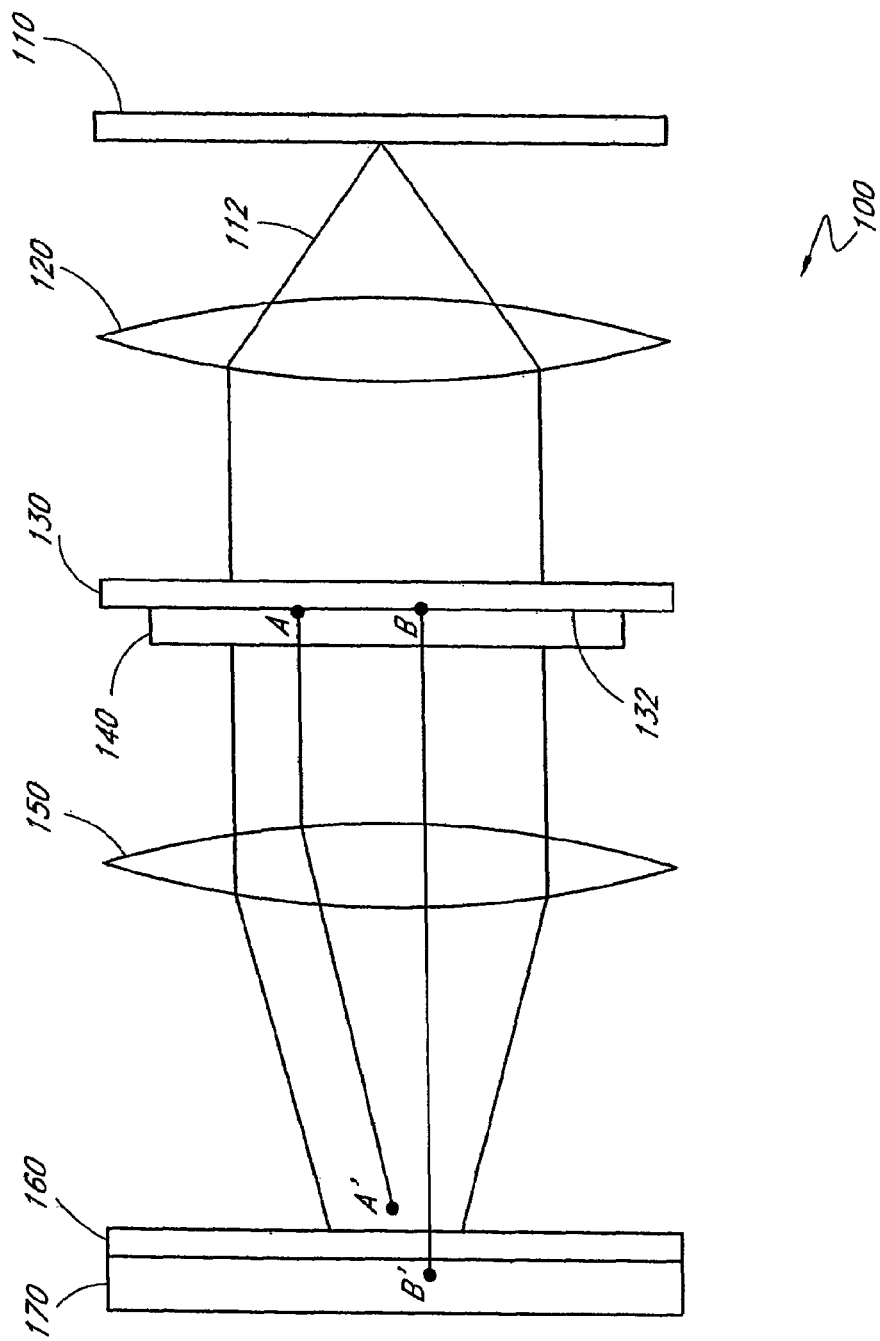
FIG. 1 is a schematic diagram showing a typical optical system having a defective reticle.

FIG. 1 is a schematic diagram showing typical physical components of an optical system having a defective reticle. A photolithography system 100 comprises a light source 110 configured to project light rays 112 to a condenser lens 120. The condenser lens 120 collimates the light rays towards a reticle 130 having a chrome pattern 132. As noted above, the reticle 130 may be an optically clear quartz substrate used to project an image onto a surface. The reticle 130 is often covered by a pellicle 140 to seal off the surface of the reticle 130 from airborne particulates and other forms of contamination. As further described below, contaminants may interfere with the optical characteristics of the reticle 130 and, hence, distort the projection of the pattern 132. The pellicle 140 is a very thin, transparent film which may not interfere with the optical characteristics of the reticle 130. The pellicle 140 may also reduce the frequency of cleaning and extend the life time of the reticle 130.

The pellicle 140 passes the light rays 112 to a lens system 150. Although only one lens is shown in FIG. 1, the lens system 150 may comprise one or more optical lenses. The lens system 150 focuses the light rays 112 onto an exposure field, such as a photoresist layer 160. The photoresist layer 160 typically comprises a light-sensitive, substantially uniform, and thin film spread on a wafer 170. A desired pattern may be formed by exposing the photoresist layer 160 to light that is masked with a predetermined pattern, e.g., the pattern 132 of the reticle 130.

As described above, when designing such an optical system, any one of these components may be subject to manufacturing imperfections. More particularly, pattern distortions may result from defects caused during manufacturing of the reticle 130 or pellicle 140. These defects may cause unacceptable variations in the pattern on the photoresist layer 160. For example, due to a defect in the reticle 130, a point A of the pattern 132 may be projected as A' at a location before its intended projected location on the photoresist layer 160. Similarly, a point B of the pattern 132 may be projected as B' at a location after its intended projected location on the photoresist layer 160. Accordingly, any point on the pattern 132 may deviate from its intended projected location due to a distortion in virtually any geometric direction of the three dimensional space. As noted above, any of these pattern distortions may vary the CD's in the wafer 170 to unacceptable levels, which include CD's that are bridged, relatively small, scummed, or other defects which are generally known for CD's in the art. Accordingly, it is desirable to correct these distortions without having to replace the reticle 130 and/or pellicle 140.

Figure 2:
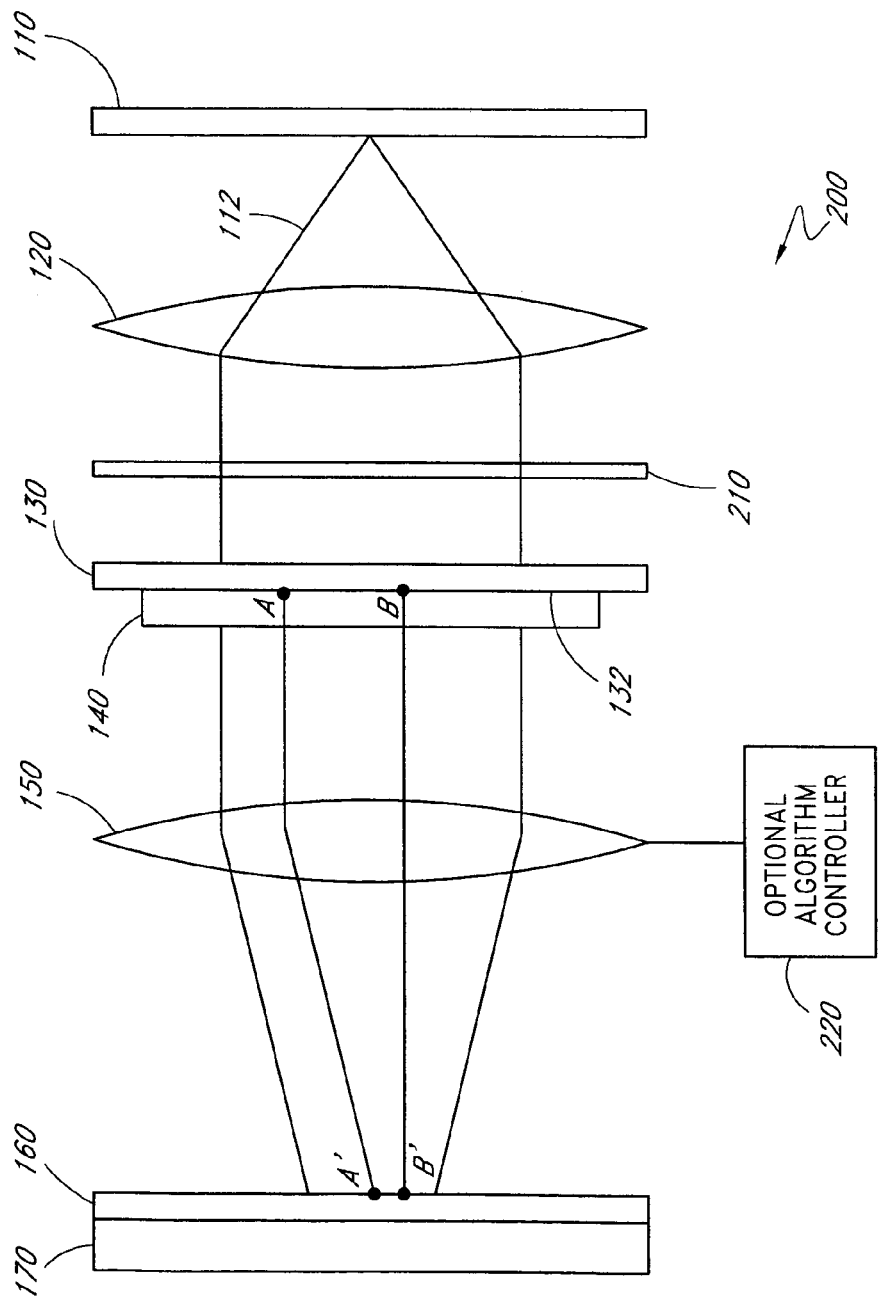
FIG. 2 is a schematic diagram of the optical system of FIG. 1 having the corrective filter in accordance with the invention.

FIG. 2 is a schematic diagram of the photolithography system 200 having a corrective filter 210 in accordance with the invention. In one embodiment, the corrective filter 210 may be placed at any position between the light source 110 and reticle 130, as shown in FIG. 2. In another embodiment, the corrective filter 210 may be placed between the reticle 130 and photoresist layer 160, i.e., after the reticle 130. It is desirable to place the corrective filter 210 at a location that does not interfere with heat dissipation characteristics of the lens system 150. In some applications, the lens system 150 may heat up due to energy emanating from the light rays. Typically, the rise in temperature of the lens system 150 affects its optical properties and, consequently, causes a distorted projection of light onto the photoresist layer 160. To compensate for such optical distortion, the lens system 150 is often controlled by an optical algorithm 220 which adjusts the optical properties of the lens system 150 as a function of temperature. Placing an object within a close proximity of the lens system 150 may interfere with its heat dissipation characteristics and cause the optical algorithm to erroneously compensate for heat variations. The distance between the lens system 150 and reticle 130 varies from one photolithography system to another and, generally, is about 3–4 inches. Thus, it is desirable to place the corrective filter 210 at a minimum distance of about 1 inch from the lens system 150. However, if the machinery or robotic equipment that places the corrective filter 210 is configurable to such distances, other distances may be acceptable so long as interference with heat dissipation characteristics of the lens system 150 is tolerable.

In another embodiment, the corrective filter 210 may be designed for placement in close proximity to, or manufactured in combination with, the reticle 130. For example, the pellicle 140 may be designed to have the corrective properties of the corrective filter 210 for attachment to the reticle 130. Alternatively, the corrective filter 210 may be designed separately from the pellicle 140 and attached to the reticle 130 to form a substantially coherent unit. In such an embodiment, the reticle 130 effectively comprises a first plate that contains the predetermined pattern and a second plate attached to the first plate. Thus, the second plate includes the corrective filter 210. As demonstrated by these examples, there may be several design variations and locations of the corrective filter 210 which will become apparent to one of ordinary skill in the art from this description.

With the corrective filter 210 positioned between the condenser lens 120 and reticle 130, the reticle 130 correctly projects the pattern 132 onto the photoresist layer 160. More particularly, the corrective filter 210 compensates for any variation in substantially all the points of the pattern 132. For example, the corrective filter 210 corrects the projection of the point A of the pattern 132 so that its projection A' is located at the intended position on the photoresist layer 160. Similarly, the point B of the pattern 132 is corrected so that its projection B' is located at the intended position on the photoresist layer 160. As illustrated by the projection of the two points A and B, the corrective filter 210 corrects substantially all forms of optical distortions including reticle and pellicle defects due to myopia, hyperopia, and astigmatism.

Figure 3:
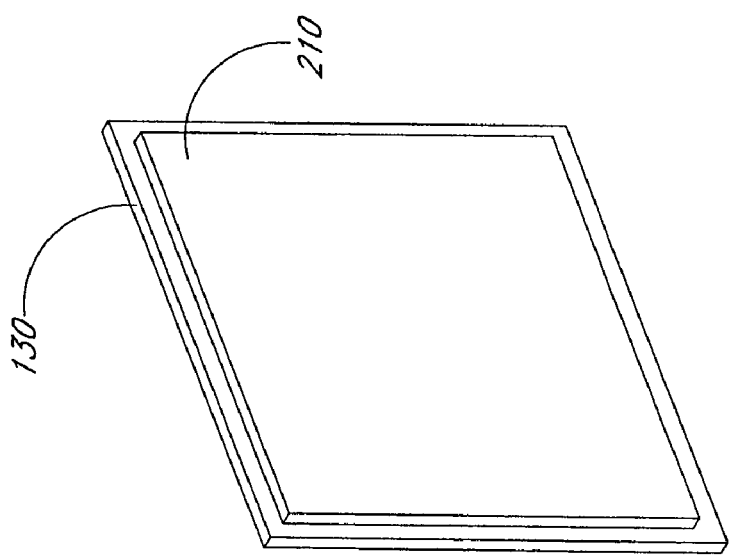
FIG. 3 is a perspective view of one embodiment of the corrective filter built in combination with a defective reticle.

FIG. 3 is a perspective view of one embodiment of the corrective filter 210 built in combination with a defective reticle 130. As noted above, the corrective filter 210 may be attached to the reticle 130 so as to substantially form a coherent unit. In one embodiment, the corrective filter 210 may be designed to take over the functions of the pellicle 140, thereby protecting the surface of the reticle 130 from airborne particulates and other forms of contamination. In another embodiment, the corrective filter 210 may, in addition to the pellicle 140, be attached to the reticle 130. Moreover, depending on the application, the corrective filter 210 may be attached anterior or posterior to the reticle 130.

Although a rectangular shape is shown for the corrective filter 210 in FIG. 3, it will be understood that the geometric shape of the corrective filter 210 may be customized to fit virtually any desired dimensions and shapes suitable for the photolithography system 200. For example, the corrective filter 210 may have a shape that is a square, oval, elliptical, polygonal, trapezoidal, and other similar geometric shapes. The corrective filter 210 may comprise any material commonly used to manufacture optical filters in the art, such as fused silica or calcium fluoride. Given the optical characteristics of the corrective filter 210, one of several techniques may be employed to manufacture the corrective filter 210. These techniques include diamond milling, ion-milling, and mechanical polishing.

Figure 4:
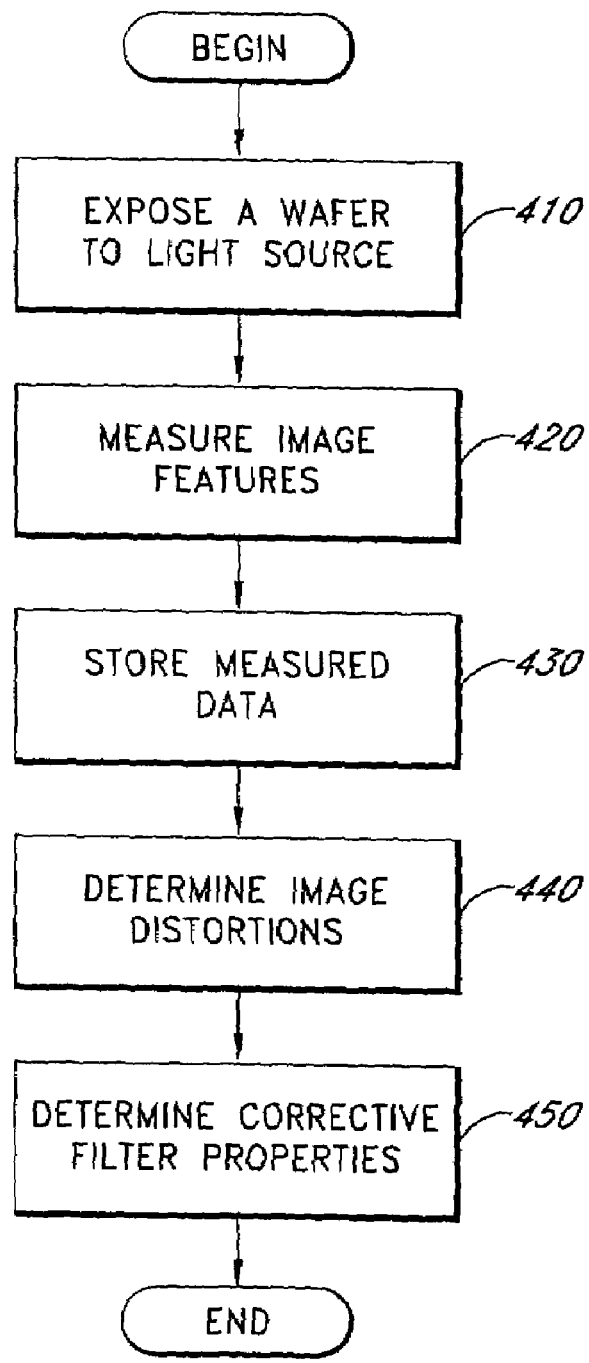
FIG. 4 is a flowchart describing the steps of determining the characteristics of the corrective filter of FIG. 2.

FIG. 4 is a flowchart describing the steps of determining the optical properties of the corrective filter of FIG. 2. To determine the optical properties of the corrective filter 210, the following method may be followed. At block 410, the wafer 170 is exposed to the light source, as illustrated in FIG. 1. Generally, it is desirable to include a lens system to compensate for the reticle's magnification (or reduction) effect on the exposed image. In some cases, e.g., if the reticle has no significant distortion on the dimension of the image, it may be unnecessary to include a lens system when exposing the wafer to the light source. A measuring instrument, such as a scanning electron microscope model number 7830SI manufactured by KLA or 8100XP manufactured by OPAL, measures one or more image features in the projected pattern on the photoresist layer 160 (block 420). Some of the measured features may include positional offsets, distances between lines and spaces, line CD's, and contact related features. The lines may be produced by the pattern 132 in an isolated (e.g., a single line) or dense (e.g., a group of multiple lines) form in the exposure field. The measurements may be taken in the horizontal, vertical, sagittal, and/or tangential geometric planes. Depending on the microscope, the measurements may be taken with varying degrees of resolution, which is often expressed in picture element (pixel) per unit area (e.g., inch) or pixel density. As is well known in the art, as the resolution increases, the finer and more detailed are the measurements. Hence, if desired, the resolution may be selectively increased to improve the accuracy of correction. More particularly, for fine (e.g., smaller CDs) reticle regions the resolution of measurement may be selectively increased. Similarly, for coarse (e.g., larger CDs) reticle regions the resolution of measurement may be selectively decreased. Hence, the type of measurements may vary to accommodate various regions of the same reticle 130.

The measurements may be stored in a computer memory, such as a hard disk, for further processing (block 430). Programmed with proper instructions, the computer analyzes the measurements to determine the distortions or errors across the exposure field (block 440). For example, based on the geometric difference between measured and expected projected point features, such as point size and positional offset, the computer determines the optical deviation (i.e., offset) of the projected image from that expected by a defect-free reticle. The instructions may be programmed using any computer language used in the art, such as C, Fortran, or other similar languages. Alternatively, a dedicated processor having instructions in the form of firmware may be used to implement this method. In either case, based on the calculated offsets for all measured pixels, the computer determines the optical correction characteristics of the corrective filter 210 (block 450).

FIG. 5A is a ray diagram of light rays passing through the reticle 130 having one or more defects. As shown in FIG. 5A, the reticle 130 typically includes a pattern 132 that causes a desired pattern to be projected in the exposure field on the wafer 170 (not shown in this figure). As noted above, as light rays 520 pass through the reticle 130, a defect in the reticle 130 causes a defect in the pattern of the exposed image. For example, the defect may comprise regions 510*a* and 511*a* that are unacceptably narrow or small. The defective regions 510*a* and 511*a* may be caused by an excess overflow of the layer of the pattern 132. If left uncorrected, the regions 510*a* and 511*a* cause unacceptable defects (e.g., CD variations) in the exposure field of the wafer 170.

Accordingly, FIG. 5B shows a ray diagram of light rays passing through the reticle 130 after correction by the corrective filter 210 in accordance with the invention. In this embodiment, the corrective filter 210 is placed after the reticle 130, i.e., at a distance from the light source 110 (not shown in this figure) that is greater than the distance between the reticle 130 and the light source 110. It is desirable to position and, more particularly, align the corrective filter 210 so as to cause light rays received from the defective regions 510*a* and 511*a* to diverge, thereby widening the defective regions 510*a* and 511*a* to regions 510*b* and 511*b*, respectively. Thus, the corrective filter 210 includes corrective elements having optically divergent properties, such as one or more divergent lens-like regions 510*b* and 511*b* that are optically aligned to respectively correct the defective regions 510*a* and 511*a* to the same or various degree of divergence. In other embodiments, the corrective filter 210 may include one or more convergent lens-like regions (not shown in this figure) that are optically aligned with defective reticle regions requiring same or various degrees of convergence. Additionally, the corrective filter 210 may include one or more regions 515*b* having a substantially small or no optical effect on light rays received from reticle regions that are not defective, or having only minor defects, e.g., the region 515*a*.

Therefore, with its convergent and divergent optical properties, the corrective filter 210 may correct virtually all forms of reticle defects, including deviations in the pattern 132 due to an absence of or excess in pattern material (e.g., chrome). Moreover, the corrective filter 210 may correct defects arising from the lens system 150, or from any other source in the photolithography system 100. Accordingly, in some applications, the corrective filter 210 may compensate for defects without having to determine the exact source of the defect.

In view of the foregoing, it will be appreciated that the invention overcomes the long-standing need for a correction filter and method of correcting defects in individual components of an optical system, such as the reticle. The invention may be embodied in other specific forms without departing from its spirit or essential characteristics. The described embodiment is to be considered in all respects only illustrative and not restrictive. The scope of the invention is, therefore, indicated by the appended claims rather by the foregoing description. All changes which fall within the meaning and range of equivalency of the claims are to be embraced within their scope.

What is claimed is:

1. A photolithography system comprising:
   a reticle comprising a pattern configured to receive light from a source and project a first image onto a geometric plane, the reticle further comprising a defect causing a deviation in the first image from a second image producible by a defect-free pattern; and
   a filter located substantially in said geometric plane, the filter being configured to receive the first image substantially without optical processing after light passes through the reticle, the filter comprising at least one portion configured to substantially remove the deviation.

2. The system of claim 1, further comprising a pellicle attached to the reticle and configured to cover the pattern of the reticle.

3. The system of claim 2, wherein the pellicle is configured such that interference with optical characteristics of the reticle is minimized.

4. The system of claim 2, wherein the pellicle comprises the filter.

5. The system of claim 1, wherein the filter is located immediately next to the reticle in a direction away from the source.

6. The system of claim 1, further comprising at least one lens located between the filter and the plane.

7. The system of claim 1, wherein the at least one portion is configured to focus or defocus light rays comprising the deviation.

8. The system of claim 1, wherein the at least one portion of the filter is optically aligned with the defect such that light rays comprising the deviation are directed to the at least one portion of the filter.

9. The system of claim 1, wherein the defect comprises a region in the pattern that is undesirably transmissive or obstructive to light.

10. A photolithography system comprising:
a reticle comprising a pattern configured to receive light from a source and project a first image toward a geometric plane;
an object having a defect formed therein, the object being located along a passage way of the light from the source to the plane, the defect causing a deviation in the first image from a second image producible by a defect-free object;
a filter located immediately after the reticle along the passage way of the light from the source to the geometric plane, the filter comprising at least one portion configured to selectively modify the deviation in the first image.

11. The system of claim 10, wherein the object where the defect is formed is the reticle, the pattern, a pellicle or a lens located along the passage way of the light.

12. The system of claim 10, wherein the reticle further comprises a pellicle attached thereto and covering a surface of the reticle.

13. The system of claim 12, wherein the pellicle covers the surface of the reticle facing the plane.

14. The system of claim 12, wherein the pellicle comprises the filter.

15. The system of claim 10, wherein the at least one portion is configured to focus or defocus light rays comprising the deviation.

16. The system of claim 10, further comprising a wafer selectively coated with a photo-resist layer, and wherein a top surface of the photo-resist layer comprises the plane.

17. The system of claim 10, wherein the at least one portion is geometrically related to the defect.

18. The system of claim 10, wherein the filter further comprises a pattern formed thereon, and wherein the pattern of the filter is configured to further selectively modify the deviation of the first image.

19. A method of defining a photolithography system, the method comprising:
receiving at least one geometrical measurement about a feature in a first image projected from a defective pattern;
receiving geometrical information about a feature in a second image producible by a defect-free pattern;
determining a geometrical difference between the features in the first and second images, the geometric difference representing an optical deviation of the first image from the second image; and
determining based, at least in part, on the geometrical difference optical characteristics of an optical element configured to substantially reduce the optical deviation of the first image from the second image.

20. The method of claim 19, wherein the at least one geometrical measurement is derived from at least one of horizontal, vertical, sagittal and tangential geometric planes.

21. The method of claim 19, wherein the at least one geometrical is derived by a scanning electron microscope.

22. The method of claim 21, wherein the at least one geometrical measurement is derived by varying degrees of resolution.

23. The method of claim 19, wherein the geometrical information comprises one or more of a distance between lines, a distance between spaces, and distance between positions of two points.

24. The method of claim 19, wherein the geometric difference between the features of the first and second images comprises one or more of a positional offset, an offset of a pixel size, an offset of distances between lines, and an offset of distances between spaces.

25. The method of claim 19, wherein the optical characteristics of the optical element comprises one or more of converging, diverging, transmitting and obstructing light rays incident to the optical element.

26. The method of claim 25, wherein the optical characteristics of the optical element further comprises degrees of one or more of converging, diverging, transmitting and obstructing light rays incident to the optical element.

27. The method of claim 19, wherein the method is processed by a computer programmed to perform the steps.

28. The method of claim 19, further comprising providing a filter comprising the optical element in relation to the pattern along a passage way of light from a light source to a projection plane.

29. The method of claim 28, wherein the filter is placed between the pattern and the projection plane along the passage way.

30. The method of claim 28, wherein the filter is placed between the light source and pattern along the passage way.

* * * * *